US010388841B2

(12) United States Patent
Kim et al.

(10) Patent No.: US 10,388,841 B2
(45) **Date of Patent: *Aug. 20, 2019**

(54) LIGHT EMITTING PACKAGE

(71) Applicant: LG INNOTEK CO., LTD., Seoul (KR)

(72) Inventors: Byung Mok Kim, Seoul (KR); Hiroshi Kodaira, Seoul (KR); Su Jung Jung, Seoul (KR); Bo Hee Kang, Seoul (KR); Young Jin No, Seoul (KR); Yuichiro Tanda, Seoul (KR); Satoshi Ozeki, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/863,146

(22) Filed: Jan. 5, 2018

(65) Prior Publication Data

US 2018/0130934 A1 May 10, 2018

Related U.S. Application Data

(63) Continuation of application No. 13/924,167, filed on Jun. 21, 2013, now Pat. No. 9,893,259.

(30) Foreign Application Priority Data

Aug. 9, 2012 (KR) ........................ 10-2012-0087167

(51) Int. Cl.
*H01L 33/58* (2010.01)
*H01L 33/64* (2010.01)
*H01L 33/48* (2010.01)

(52) U.S. Cl.
CPC ............ *H01L 33/642* (2013.01); *H01L 33/58* (2013.01); *H01L 33/486* (2013.01); *H01L 2924/0002* (2013.01)

(58) Field of Classification Search
CPC ..................................................... H01L 33/642
See application file for complete search history.

(56) References Cited

U.S. PATENT DOCUMENTS 7,059,040 B1 * 6/2006 Webster ................... G02B 7/02 257/E31.118
9,893,259 B2 * 2/2018 Kim ........................ H01L 33/58
(Continued)

FOREIGN PATENT DOCUMENTS

CN 1977399 6/2007
CN 102339928 2/2012
(Continued)

OTHER PUBLICATIONS

Extended European Search Report for Application No. 13177955.5 dated Dec. 23, 2015.

(Continued)

*Primary Examiner* — Kenneth Parker
*Assistant Examiner* — Christopher A Culbert
(74) *Attorney, Agent, or Firm* — KED & Associates LLP

(57) ABSTRACT

A light emitting device may include a substrate; a body which is disposed on the substrate and has a first hole having a predetermined size and a light emitting chip which is disposed within a cavity formed by the substrate and the first hole of the body. A cap may be disposed on the body and may have a second hole having a predetermined size. A transparent window may be disposed in the second hole. A lower portion of the cap is divided into a first surface and a second surface more projecting downwardly than the first surface, and at least a portion of the first surface is attached and fixed to the body.

20 Claims, 9 Drawing Sheets

(56) References Cited

U.S. PATENT DOCUMENTS

| | | | |
|---|---|---|---|
| 2004/0104460 A1 | 6/2004 | Stark | |
| 2005/0162808 A1 | 7/2005 | Nakai | |
| 2007/0176188 A1 | 8/2007 | Tanaka et al. | |
| 2007/0284993 A1 | 12/2007 | Kim et al. | |
| 2008/0303157 A1 | 12/2008 | Cheng et al. | |
| 2010/0006877 A1* | 1/2010 | Chen | H01L 33/58 257/98 |
| 2010/0311193 A1 | 12/2010 | Lin | |
| 2011/0024785 A1 | 2/2011 | Ng | |
| 2011/0260197 A1 | 10/2011 | Kim | |
| 2012/0025215 A1 | 2/2012 | Chen et al. | |
| 2012/0091500 A1 | 4/2012 | Matoba et al. | |
| 2012/0300491 A1 | 11/2012 | Hussell et al. | |

FOREIGN PATENT DOCUMENTS

| | | |
|---|---|---|
| CN | 102473813 | 5/2012 |
| CN | 102623612 | 8/2012 |
| EP | 2 421 060 | 2/2012 |
| JP | S59-107145 | 7/1984 |
| JP | 2001-237335 | 8/2001 |
| JP | 2005-235864 | 9/2005 |
| JP | 2007-123939 | 5/2007 |
| JP | 2007-180066 | 7/2007 |
| JP | 2008-109079 | 5/2008 |
| JP | 2008-192863 | 8/2008 |
| WO | WO 2011/013581 | 3/2011 |
| WO | WO 2011/163674 | 12/2011 |

OTHER PUBLICATIONS

Chinese Office Action Search Report for Application No. 201310346581.X dated Aug. 2, 2016 (full Chinese text and full English language translation).

Chinese Search Report for Application No. 201310346581.X dated Aug. 2, 2016.

Japanese Office Action dated Feb. 7, 2017 issued in Application No. 2013-098976.

Chinese Office Action issued in Application No. 201310346581X dated Apr. 5, 2017 (full Chinese text).

Chinese Search Report issued in Application No. 201310346581X dated Apr. 5, 2017 (full Chinese text).

U.S. Office Action dated Mar. 2, 2015 issued in co-pending U.S. Appl. No. 13/924,167.

U.S. Office Action dated Feb. 5, 2016 issued in co-pending U.S. Appl. No. 13/924,167.

U.S. Final Office Action dated Aug. 26, 2016 issued in co-pending U.S. Appl. No. 13/924,167.

* cited by examiner

LIGHT EMITTING PACKAGE

CROSS-REFERENCE TO RELATED APPLICATION

This application is a Continuation of U.S. patent application Ser. No. 13/924,167, filed on Jun. 21, 2013, which claims priority under 35 U.S.C. § 119(e) of Korean Patent Application No. 10-2012-0087167 filed Aug. 9, 2012 the subject matters of which are incorporated herein by reference.

BACKGROUND

1. Field

This embodiment relates to a light emitting device.

2. Background

With the developments of both a thin film growth technology and a component material, a light emitting device including a laser diode or a light emitting diode formed by using group III to V or group II to VI compound semiconductor materials of a semiconductor is able to create a variety of colors, for example, red, green, blue lights, an ultraviolet ray and the like. The light emitting device is also able to create high efficient white light by use of a fluorescent material or by a combination of the colors. Compared with a conventional light source such as a fluorescent lamp, an incandescent lamp and the like, the light emitting device has low power consumption, a semi-permanent span of life, a rapid response speed, safeness and an environment-friendliness.

Accordingly, the light emitting device or the light emitting diode is being increasingly applied to a transmission module of an optical communication means, a light emitting diode backlight replacing a cold cathode fluorescence lamp (CCFL) constituting the backlight of a liquid crystal display (LCD), a white light emitting diode lighting device replacing the fluorescent lamp or the incandescent bulb, a headlight of an automobile and a traffic light.

Regarding a light emitting package including a UV LED mounted on a metal substrate, ultraviolet reflected light reaches an insulation layer on the metal substrate, and thus, an organic material included in the insulation layer is discolored or deteriorated. As a result, light output of the light emitting device maybe degraded and reliability is reduced.

SUMMARY

One embodiment is a lighting device. The lighting device may include: a substrate; a body which is disposed on the substrate and has a first hole having a predetermined size; a light emitting chip which is disposed within a cavity formed by the substrate and the first hole of the body; a cap which is disposed on the body and has a second hole having a predetermined size; and a transparent window which is disposed in the second hole, wherein a lower portion of the cap is divided into a first surface and a second surface more projecting downwardly than the first surface and wherein at least a portion of the first surface is attached and fixed to the body.

Another embodiment is a lighting device. The lighting device may include: a substrate; a body which is disposed on the substrate and has a first hole having a predetermined size; a light emitting chip which is disposed within a cavity formed by the substrate and the hole of the body; a cap which is disposed on the body and has a second hole having a predetermined size; and a transparent window which is disposed in the second hole, wherein an upper diameter of the second hole is less than a lower diameter of the second hole, so that a level difference is formed, and wherein the transparent window is disposed in a lower portion of the second hole.

BRIEF DESCRIPTION OF THE DRAWINGS

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being ‘on’ or “under” another element, it may be directly on/under the element, and/or one or more intervening elements may also be present. When an element is referred to as being ‘on’ or ‘under’, ‘under the element’ as well as ‘on the element’ may be included based on the element.

An embodiment may be described in detail with reference to the accompanying drawings.

Configuration Example of a First Embodiment

Figure 1:
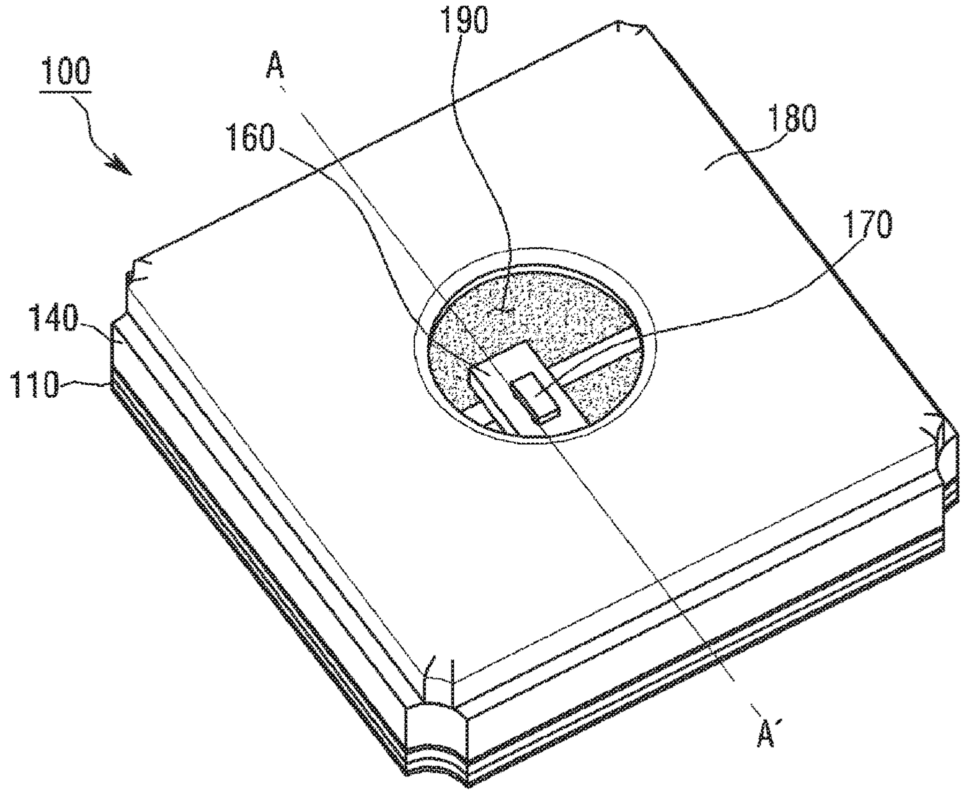
FIG. 1 is a perspective view of a light emitting device according to a first embodiment.
Figure 2:
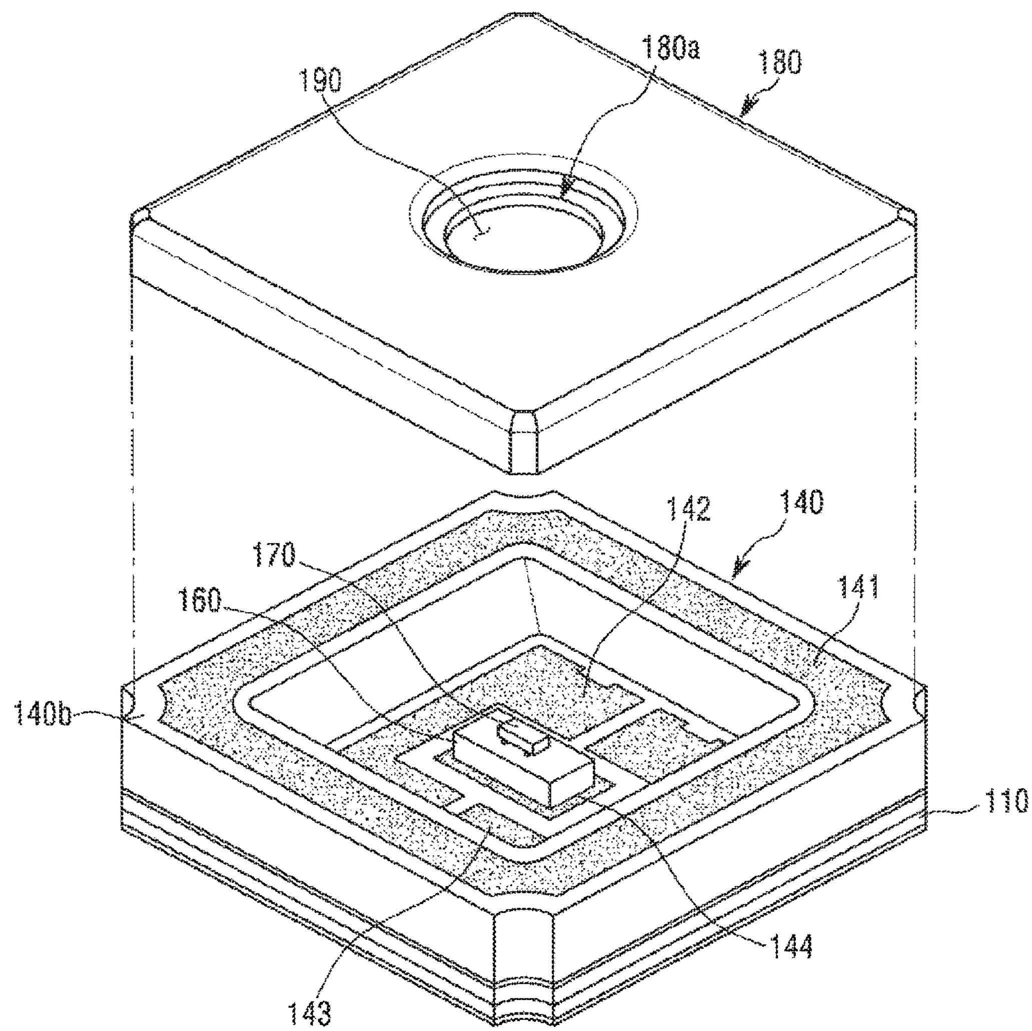
FIG. 2 is an exploded perspective view of the light emitting device shown in FIG. 1.
Figure 3:
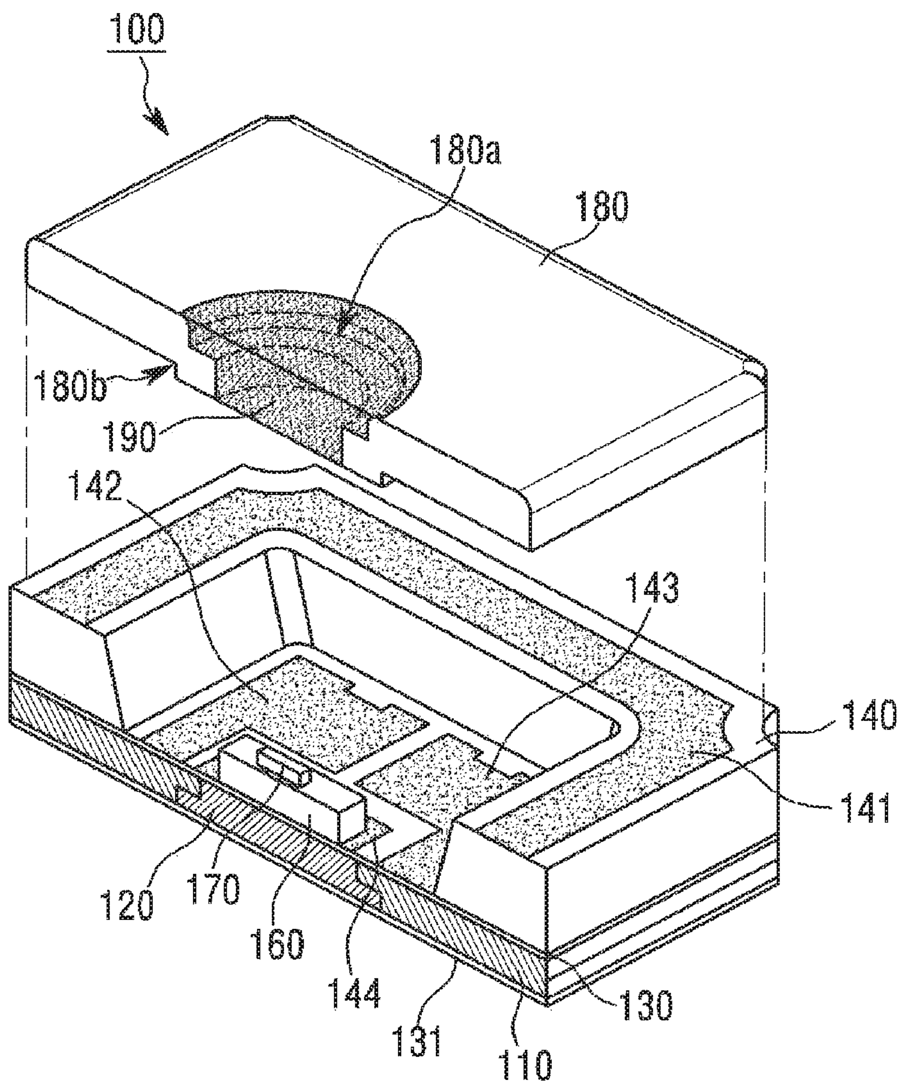
FIG. 3 is an exploded view formed by cutting the light emitting device shown in FIG. 1 along line A-A'.
Figure 4:
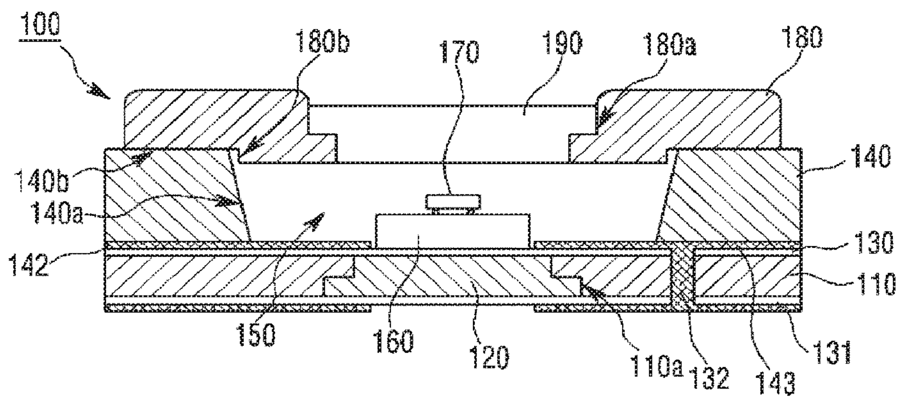
FIG. 4 is a cross sectional view formed by cutting the light emitting device shown in FIG. 1 along line A-A'.
Figure 5:
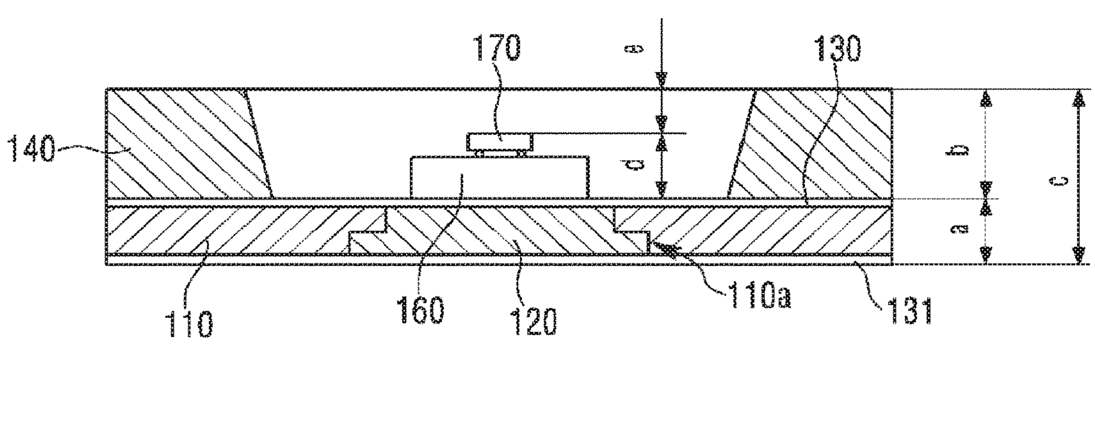
FIGS. 5 to 7 are cross sectional views showing design measures of the light emitting device.
Figure 6:
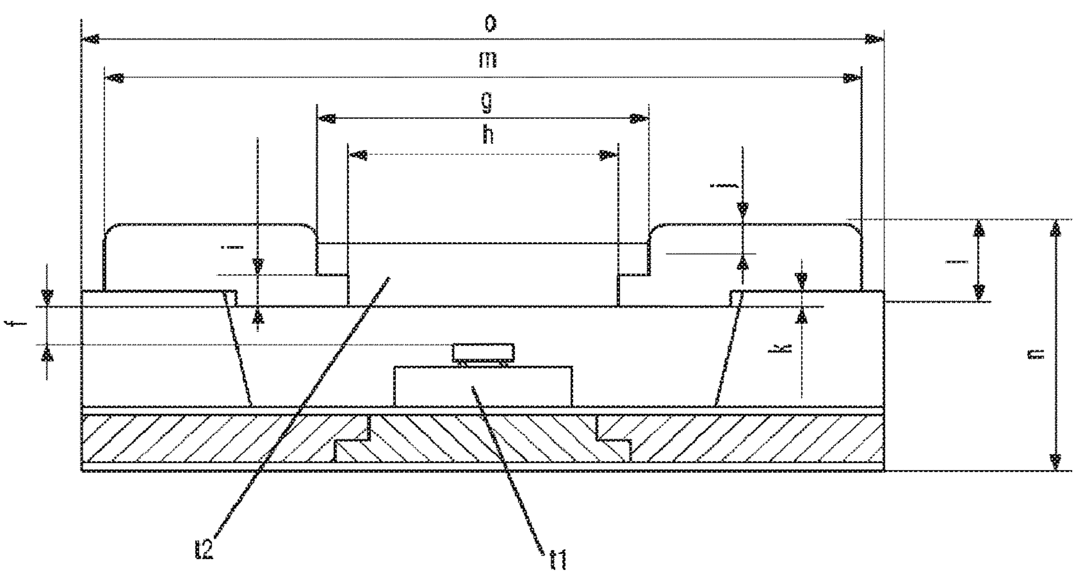
Figure 7:
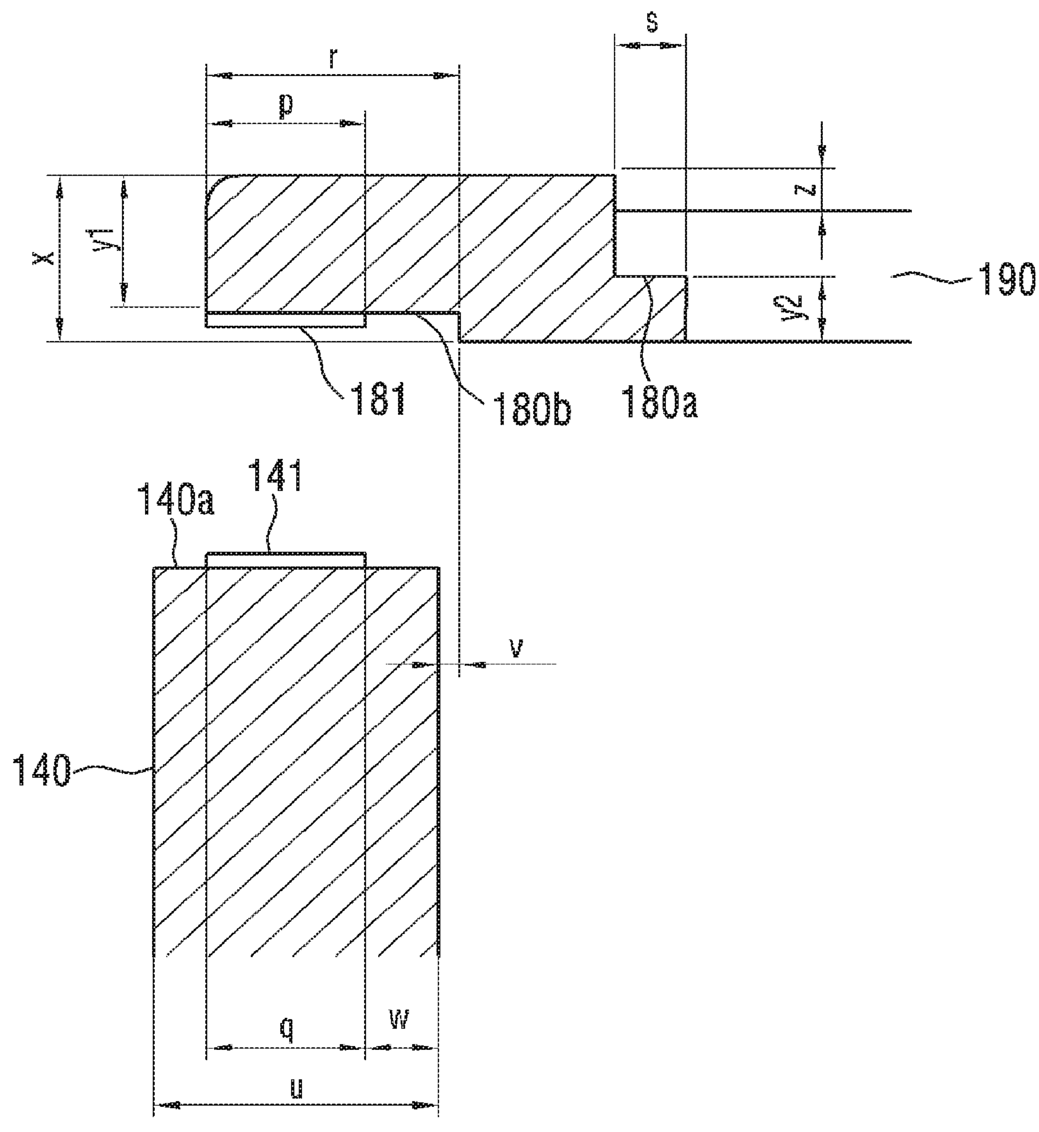

FIGS. 1 to 7 are views of a light emitting device according to a first embodiment. FIG. 1 is a perspective view of the light emitting device according to the first embodiment. FIG. 2 is an exploded perspective view of the light emitting device shown in FIG. 1. FIG. 3 is an exploded view formed by cutting the light emitting device shown in FIG. 1 along line A-A'. FIG. 4 is a cross sectional view formed by cutting the light emitting device shown in FIG. 1 along line A-A'. FIGS. 5 to 7 are cross sectional views showing design measures of the light emitting device.

A light emitting device 100 according to the first embodiment may include, as shown in FIGS. 1 to 4, a substrate 110, a body 140 which is disposed on the substrate 110 and has a through-hole **140*a* formed therein, at least one light emitting chip 170 which is disposed within a cavity 150** formed by the substrate 110 and the through-hole 140*a*, a cap 180 which is disposed on the body 140 and has a through-hole 180*a* formed therein, and a transparent window 190 which is disposed within the through-hole 180*a* of the cap 180. The substrate 110 may also include a through-hole 110*a* and a heat radiation block 120 disposed within the through-hole 110*a*. In this case, the substrate 110 may be divided into a ceramic-made body and the heat radiation block 120 inserted into the through-hole 110*a*. The light emitting chip 170 may be more attached and fixed to a sub-mount 160, and disposed on the substrate 110. When the heat radiation block 120 is disposed within the through-hole 110*a* formed in the substrate 110, the sub-mount 160 may be disposed on the heat radiation block 120.

Here, the through-hole 140*a*, the through-hole 180*a* and the through-hole 110*a* may be designated as a first hole, a second hole and a third hole respectively in order that they are distinguished from each other.

The substrate 110 may be a single-layered substrate or a multi-layered ceramic substrate. When the substrate 110 is the single-layered substrate, the substrate 110 can be formed by using a high temperature co-fired ceramic (HTCC) technology. Here, the high temperature co-fired ceramic may be formed by co-firing ceramic sheets at a high temperature higher than 1,200° C.

When the substrate 110 is the multi-layered ceramic substrate, the substrate 110 may be composed of, for example, the high temperature co-fired ceramic (HTCC) or a low temperature co-fired ceramic (LTCC).

The thicknesses of the layers of the multi-layered ceramic substrate may be the same as each other or may be different from each other. There is no limit to the thickness.

As mention above, since the substrate 110 includes a ceramic substrate, hereafter, the substrate 110 is denoted by a ceramic substrate.

The ceramic substrate 110 may have a thermal conductivity less than that of a metallic material. Therefore, for the purpose of compensating for thermal characteristics, the metal slug-made heat radiation block 120 may be co-fired or is heat-treated in an AgCu bonding process, and then is coupled to or inserted into the ceramic substrate 110.

A zener-diode may be mounted on a position of the ceramic substrate 110 or the body 140, which is separated from the space where the light emitting chip 170 is located.

As shown in FIG. 4, the through-hole 110*a* of the ceramic substrate 110 may be stepped, so that a contact area with the heat radiation block 120 is increased, and thus, heat radiation effect is improved.

The ceramic substrate 110 may be formed of a nitride insulating material or an oxide insulating material. For example, the ceramic substrate 110 may include $SiO_2$, $Si_xO_y$, $Si_3N_y$, $SiO_xN_y$, $Al_2O_3$, or AlN. When the ceramic substrate 110 includes AlN, the ceramic substrate 110 may not include the heat radiation block 120.

Conductive patterns 142 and 143 may be disposed on the upper surface of the ceramic substrate 110. And conductive patterns may be disposed on the lower surface of the ceramic substrate 110. The ceramic substrate 110 may have a via hole 132 disposed on one side thereof. The conductive patterns disposed on the upper surface and lower surface of the ceramic substrate 110 may be electrically connected to each other through the via hole 132. Although the via hole 132 is not shown in the following drawings, the via hole 132 may be not nonexistent. The via hole 132 may or may not be represented in the direction of the section.

The heat radiation block 120 may function to radiate heat generated from the light emitting chip 170. Therefore, the heat radiation block 120 may include metals having excellent thermal conductivity. For instance, the heat radiation block 120 may include at least one of Mo, W, Au, Ag, a Cu single metal and an alloy including Cu, for example, CuW and CuMo.

The heat generated from the light emitting chip 170 may radiate outwardly through the heat radiation block 120 having excellent thermal conductivity, so that the thermal characteristics and the reliability of the light emitting device 100 may be improved. The heat radiation block 120 may be co-fired or is heat-treated in an AgCu bonding process, and then is coupled to or inserted into the through-hole 110*a* of the ceramic substrate 110.

Considering the thermal expansion coefficients of the ceramic substrate 110 and the heat radiation block 120, for example, in the formation of the ceramic substrate 110 through use of the HTCC technology, the heat radiation block 120 including CuW may be inserted into the substrate 110, so that the ceramic substrate 110 may be stable to the heat. In the formation of the ceramic substrate 110 through use of the LTCC technology, the heat radiation block 120 including Ag may be inserted into the substrate 110, so that the ceramic substrate 110 may become thermally resistant.

The constituent materials of the ceramic substrate 110 and the heat radiation block 120 may be different from each other, and thus, the thermal expansion coefficients of the ceramic substrate 110 and the heat radiation block 120 are also different from each other. Therefore, the heat radiation block 120 may be inserted into the ceramic substrate 110, and then may be co-fired, or the heat radiation block 120 is expanded by the heat generated from the light emitting chip 170 during the use of the light emitting device. As a result, the top surface of the heat radiation block 120 on which the light emitting chip 170 is mounted may convexly project.

When the top surface of the heat radiation block 120 projects convexly, poor contact may occur between the heat radiation block 120 and the light emitting chip 170, so that the reliability may be reduced. Therefore, a first projection prevention layer 130 may be located between the light emitting chip 170 and the heat radiation block 120, thereby preventing the top surface of the heat radiation block 120 from projecting toward the light emitting chip 170.

The first projection prevention layer 130 may be disposed on the ceramic substrate 110 and on the heat radiation block 120 or may form a portion of the ceramic substrate 110 by being integrally formed with the ceramic substrate 110. A second projection prevention layer 131 may be disposed under the ceramic substrate 110 and the heat radiation block 120 because the bottom surface of the heat radiation block 120 as well as the top surface of the heat radiation block 120 may convexly project.

The body 140 having the cavity 150 formed therein may be disposed on the first projection prevention layer 130. The inner side wall of the body 140 may be inclined or not. The inner side wall of the body 140 may be formed in the form of stairs or may be vertically formed. The inclined side wall of the body 140 may cause the light generated from the light emitting chip 170 to be reflected from the side wall formed by the through-hole 140*a* and to travel toward the open cavity 150. Thus, light-extraction efficiency of the light emitting device 100 can be enhanced.

The through-hole 140*a* which may be formed in the form of stairs or formed vertically can be mechanically implemented by a drilling process or can be implemented by stacking and firing a plurality of ceramic layers having mutually different lengths when the body 140 is comprised of a multi-layer ceramic substrate. However, the method for implementing the through-hole 140 is not limited to this.

Also, a reflective layer may be coated on at least a portion of the side wall formed by the through-hole 140*a* of the body 140 and/or on at least a portion of the bottom surface of the body 140. The ceramic material constituting the body 140 may allow the cavity 150 to be easily formed in the process and is resistant to the heat.

When the sub-mount 160 is disposed on the first projection prevention layer 130, it may be possible more effectively to prevent the heat radiation block 120 from becoming convex than to prevent the heat radiation block 120 from becoming convex only by using the first projection prevention layer 130. The sub-mount 160 may be a conductive substrate or an insulating substrate. For example, the sub-mount 160 may include materials such as Si, SiC, AlN or the like, considering thermal conductivity and thermal expansion coefficient.

A conductive pattern (not shown) may be formed on the sub-mount 160. The light emitting chip 170 may be electrically connected to the conductive pattern. For instance, the light emitting chip 170 can be fixed through Au paste boding or Au—Sn eutectic boding. Here, the bonding may be performed by heating the Au paste at a temperature lower than 280° C. in order to prevent the light emitting chip 170 from being damaged by the heat.

Since the heat generated from the light emitting chip 170 may radiate outwardly through the sub-mount 160 and the heat radiation block 120, the sub-mount 160 may be formed of a material having excellent thermal conductivity.

Since the sub-mount 160 may be disposed on the heat radiation block 120, the heat generated from the light emitting chip 170 may radiate outwardly through the heat radiation block 120 having excellent thermal conductivity instead of the ceramic substrate 110 having relatively less thermal conductivity than that of the heat radiation block 120. As a result, the reliability of the light emitting device 100 can be improved.

In a case where the light emitting chip 170 may be directly mounted on the heat radiation block 120, when the top surface of the heat radiation block 120, on which the light emitting chip 170 is mounted, is not flat, the light emitting chip 170 comes off the heat radiation block 120 or is unstably bonded, so that heat radiation performance may be degraded. This problem can be minimized by disposing the light emitting chip 170 on the sub-mount 160 or directly on the first projection prevention layer 130 without the sub-mount 160.

The heat radiation block 120 may function to radiate outwardly the heat generated from the light emitting chip 170 and may maintain the reliability of the light emitting device 100. Therefore, the heat radiation block 120 and the light emitting chip 170 may be disposed perpendicular to and overlapped with each other.

The light emitting chip 170 may include a light emitting diode (LED) formed by using a plurality of compound semiconductor layers, for example, a group III to V semiconductor layer. The LED may be a colored LED emitting blue, green or red light, etc., or may be a UV LED. The light emitted from the LED can be created by using a variety of semiconductors. The method for creating the light emitted from the LED is not limited to this.

In particular, the ceramic substrate 110 and the body 140 may be composed of an inorganic ceramic. Therefore, even when a light emitting chip including a deep UV LED having a wavelength of about 200 nm to 300 nm or a near UV LED having a wavelength of about 300 nm to 400 nm is used, it is not expected that the upper body and lower body are discolored or deteriorated by UV light emitted from the light emitting chip. Accordingly, reliability of the light emitting device can be maintained.

The light emitting chip 170 may be bonded in a flip-chip manner or may be fixed on the ceramic substrate 110 by Au paste using bonding or by Au—Sn eutectic bonding. Here, for the purpose of preventing the light emitting chip 170 from being damaged by heat, the bonding may be performed by heating the Au paste at a temperature lower than 280° C.

Continuously, the cap 180 having the through-hole 180*a* in which the transparent window 190 has been disposed may be disposed on the body 140. The through-hole 180*a* of the cap 180 may have a level difference surface. Here, in the level difference surface of the through-hole 180*a* as shown in FIG. 4, an upper diameter of the through-hole 180*a* may be formed to be larger than a lower diameter of the through-hole 180*a*. A level difference is formed on an outer circumferential surface of the transparent window 190 in such a manner as to face the level difference surface of the through-hole 180*a* and is disposed within the through-hole 180*a* of the cap 180.

The through-hole 180*a* may have a circular shape. Here, the shape of the through-hole 180*a* is not limited to the circular shape. For example, the through-hole 180*a* may have a quadrangular shape. More specifically, the through-hole 180*a* may have a square shape or a rectangular shape. Also, the through-hole 180*a* may have a polygonal shape as well as the circular and quadrangular shapes. The transparent window 190 may have a shape corresponding to the various shapes of the through-hole 180*a*.

A level difference surface 180*b* may be formed on the lower portion of the cap 180. In other words, the lower portion of the cap is divided into a first surface and a second surface more projecting downwardly than the first surface. At least a portion of the first surface may be attached and fixed to the body. Through this, when the cap 180 is coupled to a top surface 140*b* of the body 140, a portion of the lower portion having the level difference surface 180*b* is inserted within the cavity 150.

The cap 180 and the body 140 may be coupled to each other by a sealing process through Au—Sn eutectic boding in vacuum or nitrogen $N_2$ gas. The eutectic bonding may be performed by heating an adhesive material like AuSn at a temperature higher than 280° C. Since a ceramic material has brittleness and tends to be broken by pressure, the cap 180 and the body 140 can be attached and fixed to each other by using the eutectic bonding instead of welding. The cap 180 having the aforesaid configuration may be formed by using one of metallic materials including Kovar.

The transparent window 190 may be made of a transparent material and a non-reflective coating film in order to transmit light generated from the light emitting chip 170 to the outside without absorbing the light. For example, the transparent window 190 may be made of any one of $SiO_2$ (Quartz, UV Fused Silica), $Al_2O_3$ (Sapphire), LiF, $MgF_2$, $CaF_2$, low iron transparent glass and glass including $B_2O_3$.

When the light emitting chip 170 is a UV LED, the transparent window 190 functions to prevent ultraviolet ray emitted from the light emitting chip 170 from destroying or deteriorating external organic matters of the light emitting device 100. Also, a side of the transparent window 190, which contacts with the level difference surface 180*b*, has a shape corresponding to the shape of the level difference surface 180*b*. Through this, when the cap 180 is coupled to the top surface 140*b* of the body 140, a portion of the lower portion having the level difference surface 180*b* is inserted within the cavity 150, so that a portion of the lower portion of the transparent window 190 is also inserted within the cavity 150. As a result, a gap between the light emitting chip 170 and the lower portion of the transparent window 190 can be reduced. In this case, light can be more easily emitted.

A space between the transparent window 190 and the cavity 150 may be in a vacuum state or be filled with $N_2$ gas or forming gas. Also, in the light emitting device 100, a thermal pad (not shown) may be disposed under the ceramic substrate 110 and the lower portion of the heat radiation block 120.

Since the heat generated by the light emitting chip 170 passes through the sub-mount 160 and the heat radiation block 120 and then is radiated outwardly through the thermal pad, the thermal pad may have an excellent thermal conductivity. For example, the thermal pad may be comprised of a metallic material including any one of Ag, Au and Cu.

Additionally, a thermal sheet (not shown) may be disposed between the thermal pad and the ceramic substrate 110, and between the thermal pad and the heat radiation block 120. The thermal sheet has excellent thermal conductivity, electrical insulation and flame resistance and causes the heat generating portion and the thermal pad to contact with each other, thereby maximizing a heat transfer effect.

Moreover, the light emitting device 100 may further include a molding part (not shown) which is formed within the cavity 150 in such a manner as to surround the light emitting chip 170. Here, the molding part may include at least one of Si resin which has a high or low refractive index and is mixed with a fluorescent material and hybrid resin.

Also, while the ceramic substrate 110 and the inner side wall of the body 140 are shown in one unit respectively, there may be no limit to this and each of them may be formed by stacking a plurality of layers. When each of the ceramic substrate 110 and the inner side wall of the body 140 are formed by stacking a plurality of layers, the surfaces of the through-hole 110*a* and 140*a* may be not smooth but uneven.

Example of Design Measure of the First Embodiment

FIGS. 5 to 7 are cross sectional views showing design measures of the light emitting device. Referring to FIG. 5, a sum "a" of a height of the ceramic substrate 110 and heights the first and the second projection prevention layers 130 and 131 may be from 0.2 mm to 0.6 mm, and more preferably 0.4 mm. A height "b" of the body 140 may be from 0.4 mm to 1.0 mm, and more preferably 0.7 mm. A sum "c" of the height of the body 140 and the height of the ceramic substrate 110 including the first and the second projection prevention layers 130 and 131 may be designed to be from 0.6 mm to 1.6 mm, and more preferably 1.1 mm.

A sum "d" of a height of the sub-mount 160 and a height of the light emitting chip 170 may be from 0.2 mm to 0.6 mm, and more preferably 0.4 mm. Also, a height "e" between the light emitting chip 170 and the top surface of the body 140 may be designed to be from 0.1 mm to 0.5 mm, and more preferably 0.3 mm.

Referring to FIG. 6, a thickness "t1" of the sub-mount 160 may be from 0.05 mm to 0.45 mm, and more particularly 0.25 mm. A gap "f" between the light emitting chip 170 and the transparent window 190 may be from 0.1 mm to 0.3 mm, and more particularly 0.2 mm. An upper diameter "g" of the transparent window 190 may be from 1.7 mm to 2.0 mm, and more particularly 1.9 mm. A lower diameter "h" of the transparent window 190 may be from 1.3 mm to 1.7 mm, and more particularly 1.5 mm. A thickness "t2" of the transparent window 190 may be from 0.3 mm to 0.5 mm, and more particularly 0.4 mm. A height "i" from the bottom surface of the cap 180 to the level difference surface may be from 0.1 mm to 0.3 mm, and more particularly 0.2 mm. A gap "j" between the top surface of the transparent window 190 and the top surface of the cap 180 may be from 0.1 mm to 0.3 mm, and more particularly 0.2 mm. A height "k" of the level difference surface 180*b* formed on the lower portion of the cap 180 may be from 0.05 mm to 0.2 mm, and more particularly 0.1 mm. A height "l" of the side of the cap 180 may be from 0.2 mm to 0.6 mm, and more particularly 0.4 mm. A diameter "m" of the cap 180 may be from 0.4 mm to 4.4 mm, and more particularly 4.2 mm. A height "n" from the second projection prevention layer 131 to the top surface of the cap 180 may be from 1.3 mm to 1.7 mm, and more particularly 1.5 mm. Diameters "o" of the ceramic substrate 110 and the body 140 may be designed to be from 4.3 mm to 4.7 mm, and more particularly 4.5 mm.

Referring to FIG. 7, an AuSn layer 181 may be formed to have a thickness of from 5 μm to 7 μm and a width "p" of from 0.4 mm to 0.7 mm, and more particularly 0.45 mm on the level difference surface 180*b* formed on the lower portion of the cap 180. An Au pattern 141 may be formed to have a thickness larger than 5 μm and a width "q" of from 0.5 mm to 0.8 mm, and more particularly 0.5 mm on the top surface 140*b* of the body 140, which is coupled to the level difference surface 180*b* of the cap 180. Here, the width "p" of the AuSn layer 181 may be less than the width "q" of the Au pattern 141.

In addition, a width "r" of the level difference surface 180*b* formed on the lower portion of the cap 180 may be from 0.5 mm to 0.9 mm, and more particularly 0.7 mm. A width "s" of the level difference surface formed in the through-hole 180*a* of the cap 180 may be from 0.1 mm to 0.3 mm, and more particularly 0.2 mm. A gap "z" between the top surface of the transparent window 190 and the top surface of the cap 180 may be from 0 to 0.2 mm, and more particularly 0.1 mm. A thickness "x" of the cap 180 may be from 0.3 mm to 0.7 mm, and more particularly 0.5 mm. A width "u" of the body 140 may be from 0.6 mm to 1.0 mm, and more particularly 0.8 mm. A gap "v" between the cap 180 and the body 140 at the time of their coupling may be from 0.03 mm to 0.07 mm, and more particularly 0.05 mm. A height "y1" from the top surface of the cap 180 to the level difference surface 180*b* may be from 0.3 mm to 0.5 mm, and more particularly 0.4 mm. A height "y2" from the bottom surface of the cap 180 to the level difference surface formed in the through-hole 180*a* may be from 0.1 mm to 0.3 mm, and more particularly 0.2 mm. A gap "w" between the edge of the body 140 and the Au pattern 141 formed on the top surface 140*b* of the body 140 may be designed to be from 0.1 mm to 0.2 mm, and more particularly 0.15 mm.

Configuration Example of a Second Embodiment

Figure 8:
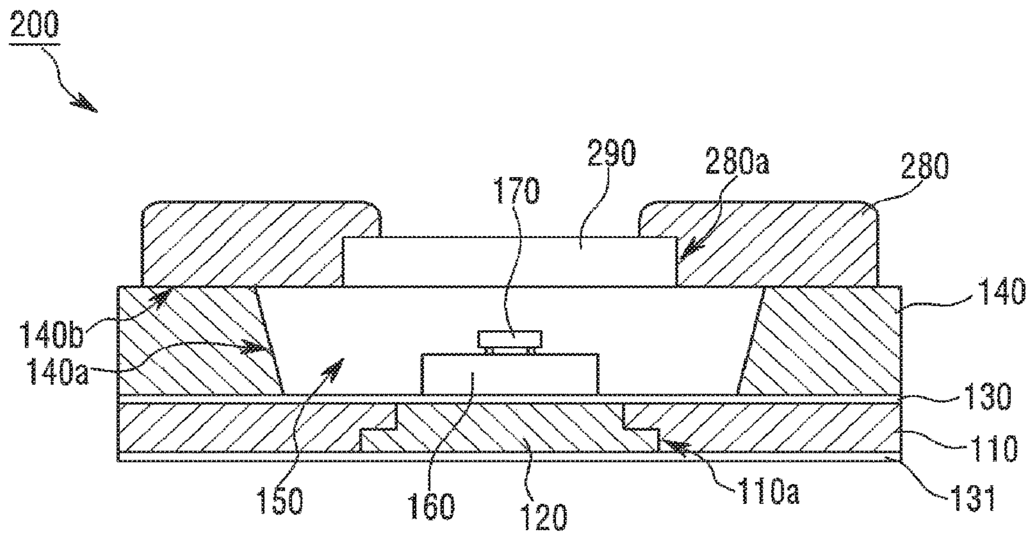
FIG. 8 is a cross sectional view showing a configuration of a light emitting device according to a second embodiment.
Figure 9:
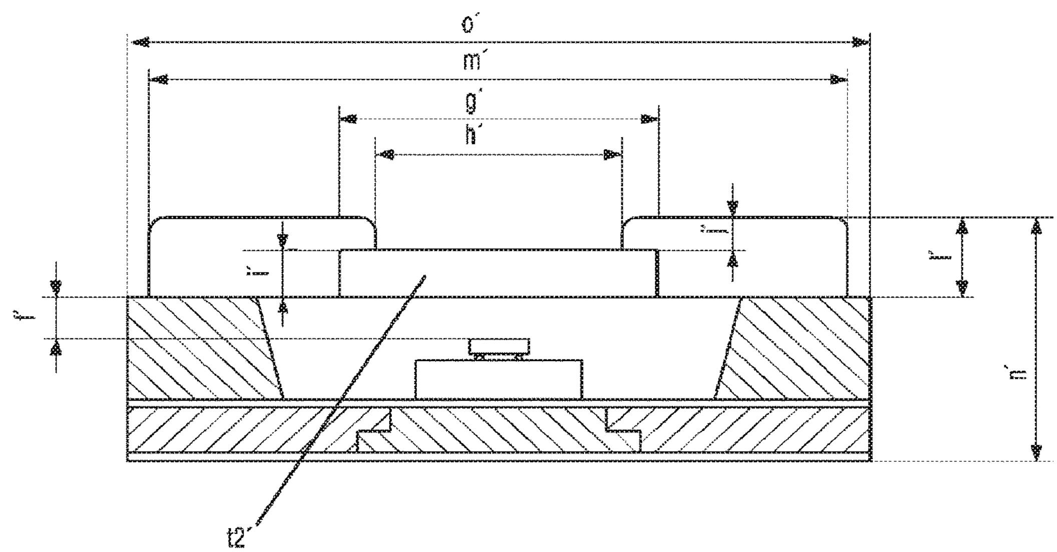
FIGS. 9 and 10 are cross sectional views showing design measures of the light emitting device.
Figure 10:
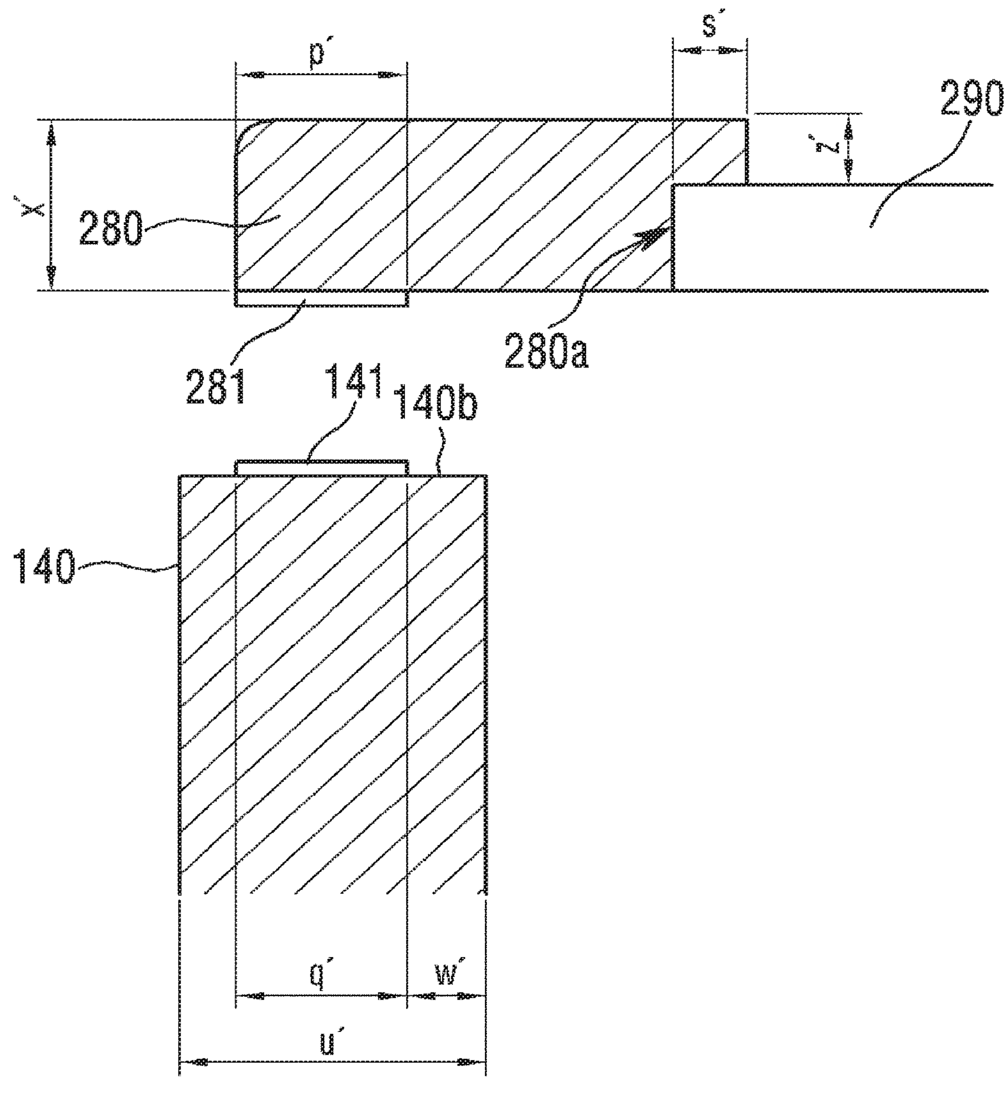

FIGS. 8 to 10 are views of a light emitting device according to a second embodiment. FIG. 8 is a cross sectional view showing a configuration of the light emitting device according to the second embodiment. FIGS. 9 and 10 are cross sectional views showing design measures of the light emitting device.

A light emitting device 200 of the second embodiment may include, as shown in FIG. 8, the ceramic substrate 110 having the through-hole 110*a* formed therein, the heat radiation block 120 disposed within the through-hole 110*a*, the body 140 which is disposed on the ceramic substrate 110 and has the through-hole 140*a*, the sub-mount 160 disposed on the heat radiation block 120, at least one light emitting chip 170 which is disposed on the sub-mount 160, a cap 280 which is disposed on the body 140 and has a through-hole 280*a* formed therein, and a transparent window 290 which is disposed within the through-hole 280*a* of the cap 280.

In the light emitting device 200, for the purpose of preventing the top surface of the heat radiation block 120 from projecting toward the light emitting chip 170, the first projection prevention layer 130 is disposed between the light emitting chip 170 and the heat radiation block 120, and disposed on the ceramic substrate 110. Also, the second projection prevention layer 131 is disposed under the ceramic substrate 110 and the heat radiation block 120.

The second embodiment of the light emitting device 200 may have the same configuration as that of the first embodiment (FIG. 4) with the exception of the configuration of the cap 280 and the transparent window 290. The through-hole 280*a* is formed in the center of the cap 280. The transparent window 290 is disposed in the through-hole 280*a*.

The through-hole 280*a* may have a circular shape. Here, the shape of the through-hole 280*a* is not limited to the circular shape. For example, the through-hole 280*a* may have a quadrangular shape. More specifically, the through-hole 280*a* may have a square shape or a rectangular shape. Also, the through-hole 280*a* may have a polygonal shape as well as the circular and quadrangular shapes. The transparent window 290 may have a shape corresponding to the various shapes of the through-hole 280*a*.

The cap 280 may have a level difference surface. Here, as shown in FIG. 8, due to the level difference surface of the cap 280, an upper diameter of the through-hole 280*a* may be formed to be less than a lower diameter of the through-hole 280*a*. That is, the level difference surface is formed in the lower portion of the cap 280.

The transparent window 290 may be disposed on the level difference surface of the cap 280. As a result, the transparent window 290 may be formed to have a flat plate shape.

The cap 280 and the body 140 may be coupled to each other by a sealing process through Au—Sn eutectic bonding in vacuum or nitrogen $N_2$ gas. The cap 280 having the aforesaid configuration may be formed by using one of metallic materials including Kovar.

The transparent window 190 may be made of a transparent material and a non-reflective coating film in order to transmit light generated from the light emitting chip 170 to the outside without absorbing the light. For example, the transparent window 190 may be made of any one of $SiO_2$ (Quartz, UV Fused Silica), $Al_2O_3$ (Sapphire), LiF, $MgF_2$, $CaF_2$, low iron transparent glass and glass including $B_2O_3$.

When the light emitting chip 170 is a UV LED, the transparent window 290 functions to prevent ultraviolet ray emitted from the light emitting chip 170 from destroying or deteriorating external organic matters of the light emitting device 200.

A space between the transparent window 290 and the cavity 150 may be in a vacuum state or be filled with $N_2$ gas or forming gas. Also, in the light emitting device 200, a thermal pad (not shown) may be disposed under the ceramic substrate 110 and the lower portion of the heat radiation block 120.

Since the heat generated by the light emitting chip 170 passes through the sub-mount 160 and the heat radiation block 120 and then is radiated outwardly through the thermal pad, the thermal pad may have an excellent thermal conductivity. For example, the thermal pad may be comprised of a metallic material including any one of Ag, Au and Cu.

Additionally, a thermal sheet (not shown) may be disposed between the thermal pad and the ceramic substrate 110, and between the thermal pad and the heat radiation block 120. The thermal sheet has excellent thermal conductivity, electrical insulation and flame resistance and causes the heat generating portion and the thermal pad to contact with each other, thereby maximizing a heat transfer effect.

Moreover, the light emitting device 200 may further include a molding part (not shown) which is formed within the cavity 150 in such a manner as to surround the light emitting chip 170. Here, the molding part may include at least one of Si resin which has a high or low refractive index and is mixed with a fluorescent material and hybrid resin.

Example of Design Measure of the Second Embodiment

Measures of the ceramic substrate 110, the first and the second projection prevention layers 130 and 131, the body 140, the sub-mount 160 and the light emitting chip 170 in the light emitting device 200 according to the second embodiment are the same as those of FIG. 5.

Referring to FIG. 9, a gap "f'" between the light emitting chip 170 and the transparent window 290 may be from 0.2 mm to 0.4 mm, and more particularly 0.3 mm. A maximum diameter "g'" of the transparent window 290 may be from 1.7 mm to 2.1 mm, and more particularly 1.9 mm. A thickness "t2'" of the transparent window 290 may be from 0.2 mm to 0.4 mm, and more particularly 0.3 mm. A height "i'" from the bottom surface of the cap 280 to the level difference surface may be from 0.2 mm to 0.4 mm, and more particularly 0.3 mm. A gap "j'" between the top surface of the cap 280 and the top surface of the transparent window 290 may be from 0.1 mm to 0.3 mm, and more particularly 0.2 mm. A height "l'" of the side of the cap 280 may be from 0.3 mm to 0.7 mm, and more particularly 0.5 mm. A diameter "m'" of the cap 280 may be from 0.4 mm to 4.4 mm, and more particularly 4.2 mm. A height "n'" from the second projection prevention layer 131 to the top surface of the cap 280 may be from 1.4 mm to 1.8 mm, and more particularly 1.6 mm. An upper diameter "h'" of the transparent window 290 may be from 1.3 mm to 1.7 mm, and more particularly 1.5 mm. Diameters "o'" of the ceramic substrate 110 and the body 140 may be designed to be from 4.3 mm to 4.7 mm, and more particularly 4.5 mm.

Referring to FIG. 10, an AuSn layer 281 may be formed to have a thickness of from 5 μm to 7 μm and a width "p'" of from 0.4 mm to 0.7 mm, and more particularly 0.45 mm under the cap 280 coupled to the top surface 140*b* of the body 140. The Au pattern 141 may be formed to have a thickness larger than 5 μm and a width "q'" of from 0.5 mm to 0.8 mm, and more particularly 0.5 mm on the top surface 140*b* of the body 140, which is coupled to the lower portion of the cap 280. Here, the width "p'" of the AuSn layer 281 may be less than the width of the Au pattern 141.

A width "s'" of the level difference surface formed in the through-hole 280*a* of the cap 280 may be from 0.1 mm to 0.3 mm, and more particularly 0.2 mm. A gap "z'" between the top surface of the transparent window 290 and the top surface of the cap 280 may be from 0.1 mm to 0.3 mm, and more particularly 0.2 mm. A thickness "x'" of the cap 280 may be from 0.3 mm to 0.7 mm, and more particularly 0.5 mm. A width "u'" of the body 140 may be from 0.6 mm to 1.0 mm, and more particularly 0.8 mm. A gap "w'" between the edge of the body 140 and the Au pattern formed on the top surface 140*b* of the body 140 may be designed to be from 0.1 mm to 0.2 mm, and more particularly 0.15 mm.

The light emitting device according to embodiment configured as such includes the ceramic substrate which has the through-hole, the heat radiation block which is disposed within the through-hole, the body which is disposed on the ceramic substrate and has a cavity formed inside the sidewall thereof, the sub-mount which is disposed on the heat radiation block, the light emitting chip which is disposed on the sub-mount, the cap which is disposed on the body and has the through-hole formed therein, and the transparent window which is disposed within the through-hole of the cap. Therefore, the gap between the transparent window and the light emitting chip can be reduced. As a result, optical loss can be minimized and thus the light output can be improved. In addition, process differentiation, high efficiency heat radiation and a long lifespan can be obtained by using the eutectic bonding. Further, a universal design is allowed and the light emitting device can become smaller through a compact design. Also, discoloration and deterioration caused by delamination can be prevented and the structure of the light emitting device can be improved in such a manner as to prevent external moisture or air from permeating the inside of the light emitting device. Besides, manufacturing process and cost can be reduced. Moreover, a mechanical shock generated by performing resistance welding is not caused, so that crack generation is minimally generated inside and outside the device.

Figure 11:
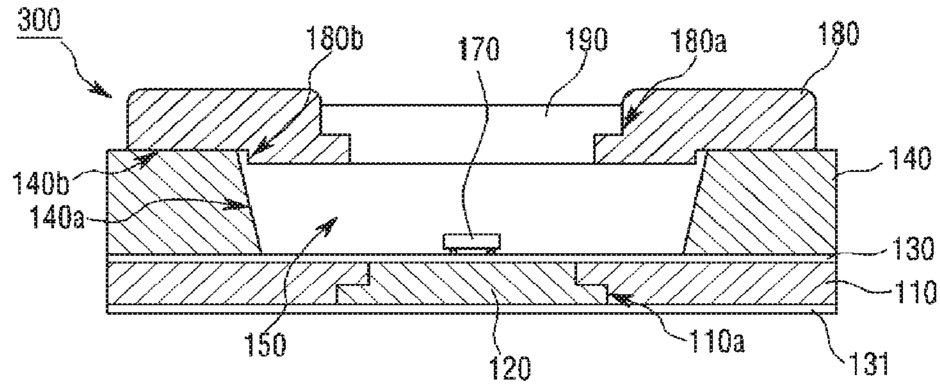
FIGS. 11 and 12 are cross sectional views of the light emitting device according to a third embodiment and a fourth embodiment.
Figure 12:
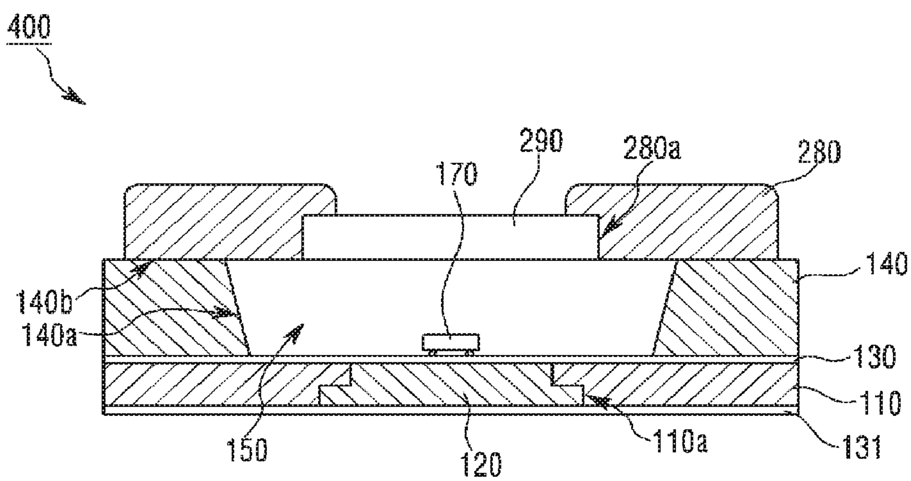

In the embodiment, in the light emitting device shown in FIG. 11 or 12, the light emitting chip 170 may be disposed on the first projection prevention layer 130 without using the sub-mount 160.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element (s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formalsense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:

a ceramic substrate including a ceramic body having a first hole and via hole;

a heat radiation block inserted in the first hole;

a first projection prevention layer directly contacting the substrate and directly contacting the heat radiation block;

a second projection prevention layer directly contacting the substrate and directly contacting the heat radiation block such that the heat radiation block is between the first projection prevention layer and the second projection prevention layer, a conductive patterns including a first conductive pattern directly contacting the first projection prevention layer and a second conductive pattern directly contacting the second projection prevention layer, the first conductive pattern and the second conductive pattern electrically connected to each other through the via hole of the substrate;

a body disposed on the substrate and having a cavity of a predetermined size;

a light emitting chip to emit an Ultraviolet (UV) light, and the light emitting chip disposed within the cavity;

a cap disposed on the body and having a second hole of a predetermined size, wherein the cap is attached and fixed to the body by an Au—Sn eutectic bonding; and a transparent window disposed in the second hole of the cap.

2. The light emitting device of claim 1, wherein at least one portion of the first conductive pattern is disposed on a top surface of the heat radiation block, and at least one portion of the second conductive pattern is disposed on a bottom surface of the heat radiation block.

3. The light emitting device of claim 1, wherein an upper diameter of the second hole is different from a lower diameter of the second hole, such that a level difference is formed between the upper diameter of the second hole and the lower diameter of the second hole, and wherein a shape of the transparent window corresponds to the second hole of the cap.

4. The light emitting device of claim 1, wherein a width of the light emitting chip is smaller than a width of the heat radiation block, and wherein a width of the substrate, a width of the first projection prevention layer, and a width of the second projection prevention layer are the same as each other.

5. The light emitting device of claim 1, wherein the light emitting chip comprises a sub-mount which is attached and fixed to a lower portion of the light emitting chip, and wherein the sub-mount is disposed on the first projection prevention layer.

6. The light emitting device of claim 1, wherein a lower portion of the cap is divided into a first surface and a second surface more projecting downwardly than the first surface, and wherein at least a portion of the first surface of the cap is attached and fixed to the body.

7. The light emitting device of claim 1, wherein the light emitting chip is fixed to the first projection prevention layer through Au paste bonding or Au—Sn eutectic bonding.

8. The light emitting device of claim 1, comprising a molding part provided within the cavity in such a manner as to surround the light emitting chip.

9. The light emitting device of claim 1, wherein the upper diameter of the second hole is less than the lower diameter of the second hole.

10. The light emitting device of claim 1, wherein a gap between the light emitting chip and the transparent window is from 0.2 mm to 0.3 mm.

11. A light emitting device comprising:

a ceramic substrate including a ceramic body having a first hole and via hole;

a heat radiation block inserted in the first hole;

a first projection prevention layer disposed on the substrate and the heat radiation block;

a second projection prevention layer disposed on the substrate and the heat radiation block such that the heat radiation block is between the first projection prevention layer and the second projection prevention layer, a conductive patterns including a first conductive pattern disposed on the first projection prevention layer and a second conductive pattern disposed on the second projection prevention layer, the first conductive pattern and the second conductive pattern electrically connected to each other through the via hole of the substrate;

a body disposed on the substrate and having a cavity of a predetermined size;

a light emitting chip to emit an Ultraviolet (UV) light, and the light emitting chip disposed within the cavity;

a cap disposed on the body and having a second hole of a predetermined size, wherein the cap is attached and fixed to the body by an Au—Sn eutectic bonding; and a transparent window disposed in the second hole of the cap, wherein an upper surface of the substrate and an upper surface of the heat radiation block are covered by the first projection prevention layer, and wherein a lower surface of the substrate and a lower surface of the heat radiation block are covered by the second projection prevention layer.

12. The light emitting device of claim 11, wherein at least one portion of the first conductive pattern is disposed on a top surface of the heat radiation block, and at least one portion of the second conductive pattern is disposed on a bottom surface of the heat radiation block.

13. The light emitting device of claim 11, wherein an upper diameter of the second hole is different from a lower diameter of the second hole, such that a level difference is formed between the upper diameter of the second hole and the lower diameter of the second hole, and wherein a shape of the transparent window corresponds to the second hole of the cap.

14. The light emitting device of claim 11, wherein a width of the light emitting chip is smaller than a width of the heat radiation block, and wherein a width of the substrate, a width of the first projection prevention layer, and a width of the second projection prevention layer are the same as each other.

15. The light emitting device of claim 11, wherein the light emitting chip comprises a sub-mount which is attached and fixed to a lower portion of the light emitting chip, and wherein the sub-mount is disposed on the first projection prevention layer.

16. The light emitting device of claim 11, wherein a lower portion of the cap is divided into a first surface and a second surface more projecting downwardly than the first surface, and wherein at least a portion of the first surface of the cap is attached and fixed to the body.

17. The light emitting device of claim 11, wherein the light emitting chip is fixed to the first projection prevention layer through Au paste bonding or Au—Sn eutectic bonding.

18. The light emitting device of claim 11, comprising a molding part provided within the cavity in such a manner as to surround the light emitting chip.

19. The light emitting device of claim 11, wherein the upper diameter of the second hole is less than the lower diameter of the second hole.

20. The light emitting device of claim 11, wherein a gap between the light emitting chip and the transparent window is from 0.2 mm to 0.3 mm.

* * * * *